United States Patent
Chen et al.

(10) Patent No.: US 12,191,127 B2
(45) Date of Patent: Jan. 7, 2025

(54) APPARATUS FOR PHYSICAL VAPOR DEPOSITION AND METHOD FOR FORMING A LAYER

(71) Applicant: TAIWAN SEMICONDUCTOR MANUFACTURING COMPANY LTD., Hsinchu (TW)

(72) Inventors: Hsin-Liang Chen, Hsinchu (TW);
Wen-Chih Wang, New Taipei (TW);
Chia-Hung Liao, Hsinchu (TW);
Cheng-Chieh Chen, Tainan (TW);
Yi-Ming Yeh, Hsinchu (TW);
Hung-Ting Lin, Hsinchu (TW);
Yung-Yao Lee, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 131 days.

(21) Appl. No.: 16/653,339

(22) Filed: Oct. 15, 2019

(65) Prior Publication Data
US 2020/0161100 A1    May 21, 2020

Related U.S. Application Data

(60) Provisional application No. 62/753,519, filed on Oct. 31, 2018.

(51) Int. Cl.
*H01J 37/34* (2006.01)
*C23C 14/34* (2006.01)
(Continued)

(52) U.S. Cl.
CPC ...... *H01J 37/3411* (2013.01); *C23C 16/4585* (2013.01); *H01J 37/32477* (2013.01);
(Continued)

(58) Field of Classification Search
CPC ............... H01J 37/3441; H01J 37/3411; H01J 37/32642; H01J 37/32651; H01J 37/32477; C23C 16/4585; C23C 14/50
See application file for complete search history.

(56) References Cited

U.S. PATENT DOCUMENTS 6,394,023 B1 * 5/2002 Crocker ................ C23C 14/564
116/201
6,423,636 B1 * 7/2002 Dordi ..................... C25D 7/123
257/E21.585

(Continued)

FOREIGN PATENT DOCUMENTS

KR    2007053864 A  *  5/2007

OTHER PUBLICATIONS

Machine Translation KR 2007053864 (Year: 2007).*

*Primary Examiner* — Michael A Band
(74) *Attorney, Agent, or Firm* — WPAT LAW; Anthony King

(57) ABSTRACT

An apparatus for PVD is provided. The apparatus includes a chamber, a pedestal disposed in the chamber to accommodate a wafer, and a ring. The ring includes a ring body having a first top surface and a second top surface, and a barrier structure disposed between the first top surface and the second top surface. The barrier structure can further include at least a first portion and a second portion separated from each other. The second vertical distance is equal to or greater than the first vertical distance.

11 Claims, 17 Drawing Sheets

(51) Int. Cl.
    *C23C 14/50*         (2006.01)
    *C23C 16/458*      (2006.01)
    *H01J 37/32*        (2006.01)

(52) U.S. Cl.
    CPC ........ *H01J 37/32642* (2013.01); *C23C 14/34* (2013.01); *C23C 14/3407* (2013.01); *C23C 14/50* (2013.01)

(56) References Cited

U.S. PATENT DOCUMENTS

| | | | |
|---|---|---|---|
| 6,623,597 | B1 | 9/2003 | Han et al. |
| 6,797,131 | B2 * | 9/2004 | Liu ........................ C23C 14/564 |
| | | | 427/446 |
| 7,026,009 | B2 * | 4/2006 | Lin ........................... C23C 4/12 |
| | | | 117/85 |
| 9,147,558 | B2 * | 9/2015 | Chia ................. H01J 37/32477 |
| 9,269,563 | B2 * | 2/2016 | Ren ..................... H01L 21/0337 |
| 9,376,752 | B2 * | 6/2016 | Goel ..................... C23C 14/541 |
| 2006/0219172 | A1 * | 10/2006 | Kuo ........................ C23C 14/50 |
| | | | 118/728 |
| 2009/0050272 | A1 * | 2/2009 | Rosenberg .......... C23C 16/4581 |
| | | | 156/345.51 |

* cited by examiner

APPARATUS FOR PHYSICAL VAPOR DEPOSITION AND METHOD FOR FORMING A LAYER

PRIORITY DATA

This patent claims the benefit of U.S. Provisional Patent Application Ser. No. 62/753,519 filed Oct. 31, 2018, the entire disclosure of which is hereby incorporated by reference.

BACKGROUND

Physical vapor deposition (PVD) is a well-known process for depositing a thin film of material on a substrate and is commonly used in the fabrication of semiconductor devices. The PVD process is carried out at high vacuum in a chamber receiving a substrate (e.g., a wafer) and containing a solid source or slab of material to be deposited on the substrate. The solid source or the slab of material is therefore referred to as a PVD target. In the PVD process, the PVD target is physically converted from a solid into a vapor. The vapor of the target material is transported from the PVD target to the substrate where it is condensed on the substrate as a thin film.

There are many methods for accomplishing PVD including evaporation, e-beam evaporation, plasma spray deposition and sputtering. Presently, sputtering is the most frequently used method for accomplishing PVD. During the sputtering, plasma is created in the chamber and directed to the PVD target. The plasma physically dislodges or erodes (sputters) atoms or molecules from the reaction surface of the PVD target into a vapor of the target material, as a result of collision with high-energy particles (ions) of the plasma. The vapor of sputtered atoms or molecules of the target material is transported to the substrate through a region of reduced pressure and condenses on the substrate, forming the thin film of the target material.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
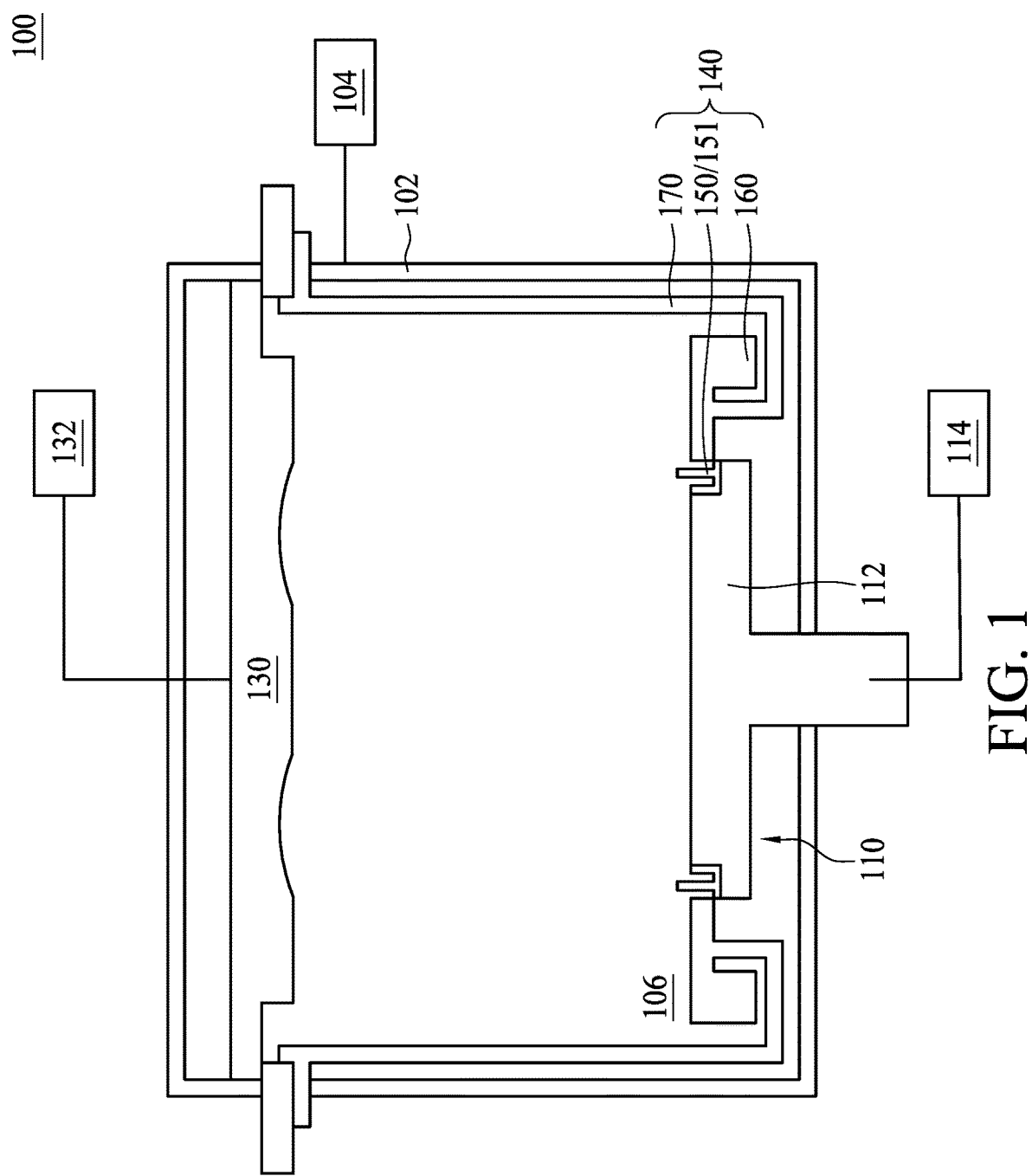
FIG. 1 is a schematic drawing illustrating an apparatus for PVD according to aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

PVD is an appropriate and widely-used process to form a thin film on a substrate (i.e., a wafer). Typically, the apparatus for performing a PVD operation includes a chamber and a process kit. The chamber may include a chamber wall and a pedestal, and the process kit may be placed within the chamber to prevent undesirable material deposition on the chamber components, such as the chamber wall and the pedestal.

Usually, the process kit includes a deposition ring. The deposition ring is disposed on the pedestal. A wafer may be disposed on the pedestal and an edge of the wafer may be above at least a portion of the deposition ring. During a PVD process for forming, for example but not limited to, a layer on the wafer, a problem recognized as arcing may occur. Arcing can be caused by factors such as contamination or residue over a surface of the wafer. It is found that the contamination or residues may cause local charge accumulation and thus serve as a potential arcing source. When a path is established from the wafer (i.e., where the residue exists) to the target through electrons or ions in the plasma, the arcing is caused. Arcing during PVD can cause a local thicker deposition of target material on the wafer. For example, an unwanted local thicker layer may be formed over a wafer edge.

In some comparative embodiments, extra cleaning operations may be performed to remove the residue, which serves as the potential arcing source, before the PVD operation. This approach may mitigate the arcing problem, but an overall throughput is reduced and process cost is increased. In other comparative embodiments, degassing time during the PVD operation is extended or a degassing temperature during the PVD operation is increased in order to mitigate the arcing problem, but the PVD operation throughput is reduced and energy consumption is increased. In still other comparative embodiments, discharge power is reduced in order to reduce charge accumulation, but this approach suffers from reduced PVD throughput. In summary, although apparatus designers have attempted to prevent arcing problem during PVD operation by making the above-mentioned modifications, none of these approaches can effectively reduce the arcing without increasing process time, energy consumption and cost, or without reducing the overall throughput.

The present disclosure therefore provides an apparatus for PVD to mitigate the arcing issue without reducing PVD throughput, increasing process cost, or increasing energy consumption. In some embodiments, a deposition ring including a barrier structure is provided. The barrier structure of the deposition ring is able to alter electron density distribution such that the path from the wafer (e.g., where the residue exists or the wafer edge) to the target through electrons or ions in the plasma may not be formed. Accordingly, arcing can be mitigated even though there is residue over the wafer.

FIG. 1 is a schematic drawing illustrating an apparatus for PVD 100 according to aspects of one or more embodiments of the present disclosure. It will be appreciated that although an apparatus is illustrated as having components specific for a PVD process, the aspects of the disclosed apparatus may be applied to any type of processing operation that utilizes plasma. For example, the disclosed aspects may be applied to a plasma-enhanced chemical vapor deposition (PECVD) operation or plasma etching operation.

Referring to FIG. 1, the apparatus for PVD 100 includes a chamber wall 102, a plasma source 104, a pedestal 110, a target 130 and a process kit 140 disposed within the chamber wall 102. The chamber wall 102 can be a stainless steel chamber body that is vacuum-tight, and a chamber 106 is enclosed within the chamber wall 102. The plasma source 104 is configured to provide plasma to the chamber 106. In some embodiments, the plasma source 104 may include an upstream source located external to the chamber 106, as shown in FIG. 1. In some alternative embodiments, the plasma source 104 can be located within the chamber 106. The pedestal 110, also referred to as wafer stage or a substrate support, is disposed within the chamber wall 102 for supporting and accommodating a workpiece, such as a wafer, to be processed. In some embodiments, the pedestal 110 may include an electrostatic chuck (ESC) 112 and/or a heater (not shown). In some embodiments, an RF bias power source 114 may be coupled to the pedestal 110 in order to induce a negative DC bias on the workpiece. In other embodiments, the pedestal 110 may be grounded or left electrically floating. In some embodiments, the apparatus for PVD 100 further includes a communication interface (not shown), for example, a monitor, showing the required operation parameters of the current deposition operation.

Referring to FIG. 1, the target 130 may have a sputtering surface. A power supply 132 can be electrically connected to the target 130. In various embodiments of the present disclosure, the power supply 132 is a DC supply, an RF power supply, or a DC-RF power supply. The target 130 is posed of metal or metal alloys which are predetermined to be deposited onto the wafer 120. The target 130 may be composed of any suitable and appropriate source material including, for example but not limited thereto, nickel (Ni), nickel platinum (Ni Pt) alloys, nickel titanium (Ni Ti) alloys, cobalt (Co), aluminum (Al), copper (Cu), titanium (Ti), tantalum (Ta), tungsten (W), indium tin oxide (ITO), zinc sulfide-silicon dioxide ($ZnS-SiO_2$), gold (Au), silver (Ag) and other noble metals.

Still referring to FIG. 1, the process kit 140 may be placed within the chamber wall 102 to prevent material from being deposited on the chamber components, such as the chamber wall 102 and the pedestal 110. Specifically, the process kit 140 includes a first ring 150 or 151, a second ring 160 and a wall shield 170. In some embodiments, the first ring 150 or 151 can be a deposition ring 150/151 and may include an annular band surrounding the pedestal 110. The second ring 160, such as a cover ring 160, also referred to as a clamp ring, may at least partially cover the deposition ring 150. In some embodiments, the cover ring 160 holds the wafer 120 in place on the pedestal 110 when a positive gas pressure is applied between the heater and the pedestal 110 such that heat can be efficiently conducted from the heater to the wafer 120. Another function served by the cover ring 160 is to allow a predetermined flow of argon to leak from under the wafer 120 into the chamber 106. The cover ring 160 is constructed with an annular shape with an oriented cut-out to match a wafer's flat side. As shown in FIG. 1, the wall shield 170 forms a seal between the cover ring 160 and the chamber wall 102 to reduce the contamination of the chamber wall 102 resulting from the particles sputtered from the target 130.

The wall shield 170 helps to prevent or minimize depositing of target material films on the interior surfaces of the chamber wall 102. The wall shield 170 may include an annular attachment portion which is mounted to the chamber wall 102, an annular vertical portion which extends downwardly from the attachment portion; and an annular horizontal portion which extends inwardly from the vertical portion.

As shown in FIG. 1, the deposition ring 150 or 151 can be disposed on the pedestal 110 and may be at least partially covered by the cover ring 160.

Figure 2:
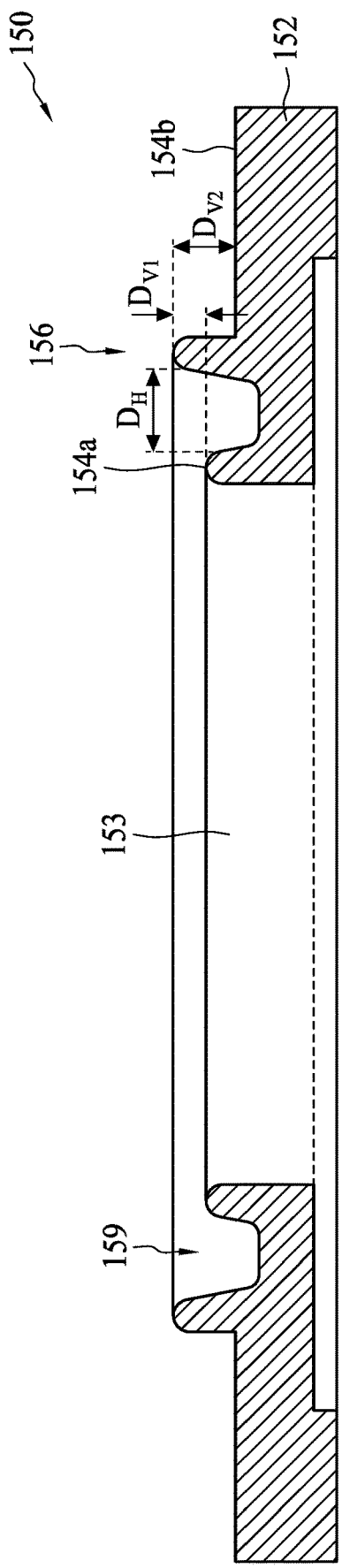
FIG. 2 is a schematic drawing illustrating a deposition ring according to aspects of one or more embodiments of the present disclosure.
Figure 3:
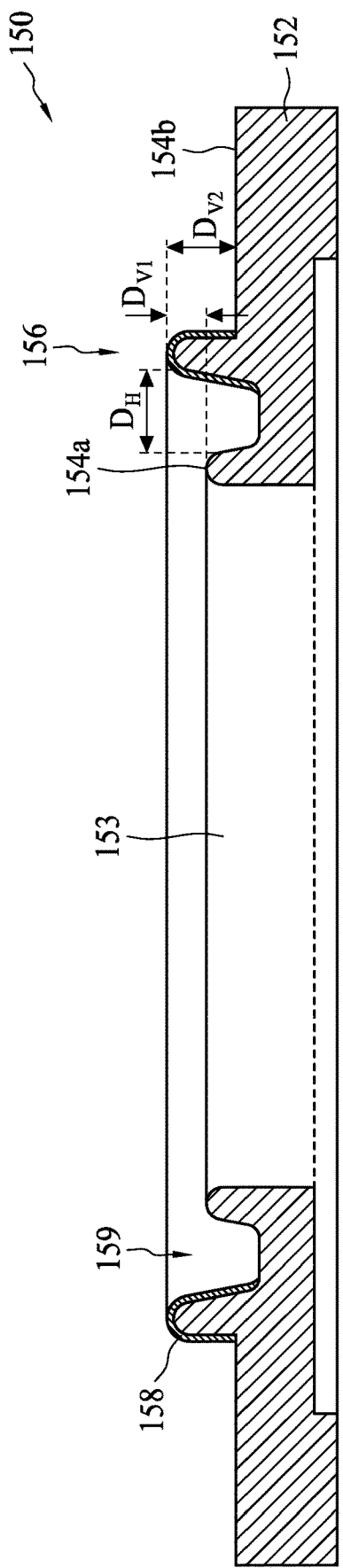
FIG. 3 is a schematic drawing illustrating a deposition ring according to aspects of one or more embodiments of the present disclosure.

Please refer to FIGS. 2 to 5, which are schematic drawings illustrating a deposition ring according to aspects of one or more embodiments of the present disclosure. As shown in FIGS. 2 and 3, the deposition ring 150 includes a ring body 152 having a first top surface 154a and a second top surface 154b, and a barrier structure 156 disposed between the first top surface 154a and the second top surface 154b. In some embodiments, an innermost surface 153 of the ring body 152, which is an annular surface, may be in contact with electrostatic chuck (ESC) 112 or pedestal 110, but the disclosure is not limited thereto. In some embodiments, the first top surface 154a is an annular surface coupled to the innermost surface 153, the barrier structure 156 is an annular structure surrounding the first top surface 154a, and the second top surface 154b is an annular surface surrounding the first top surface 154a and the barrier structure 156. In some embodiments, the ring body 152 and the barrier structure 156 are monolithic. In some embodiments, the ring body 152 and the barrier structure 156 include a same material, such as a conductive material. For example but not limited thereto, the ring body 152 and the barrier structure 156 may include stainless steel, but the disclosure is not limited thereto. In some embodiments, an insulating film 158 is disposed over the barrier structure 156, as shown in FIG. 3. In some embodiments, the insulating film 158 includes aluminum oxide ($Al_XO_Y$) or aluminum nitride ($Al_XN_Y$), but the disclosure is not limited thereto. Additionally, a bottom of the ring body 152 may have a step height, as shown in FIG. 2, in order to help to secure the ring body 152 over the pedestal 110, but the disclosure is not limited thereto. In other embodiments, the bottom of the ring body 152 can have a flat surface, though not shown.

Figure 4:
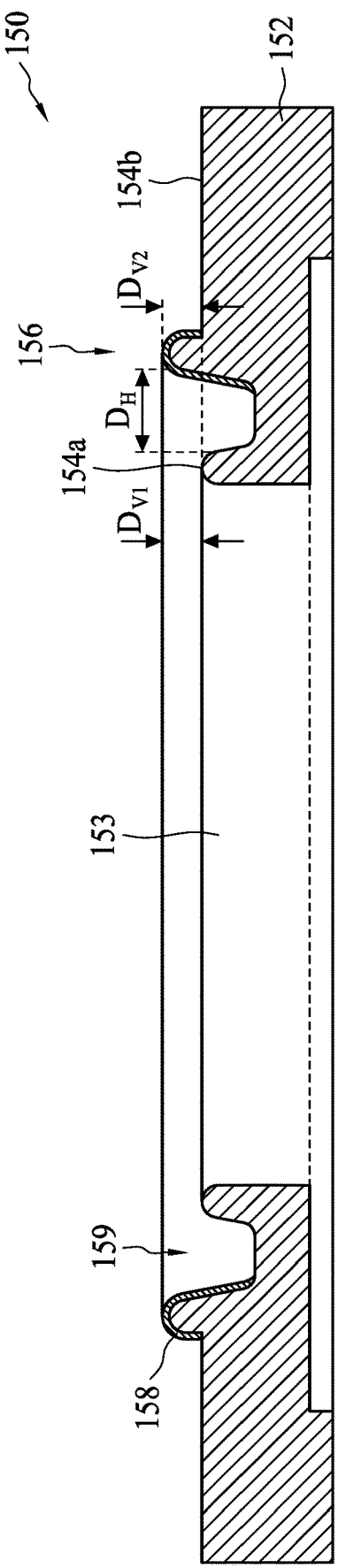
FIG. 4 is a schematic drawing illustrating a deposition ring according to aspects of one or more embodiments of the present disclosure.
Figure 5:
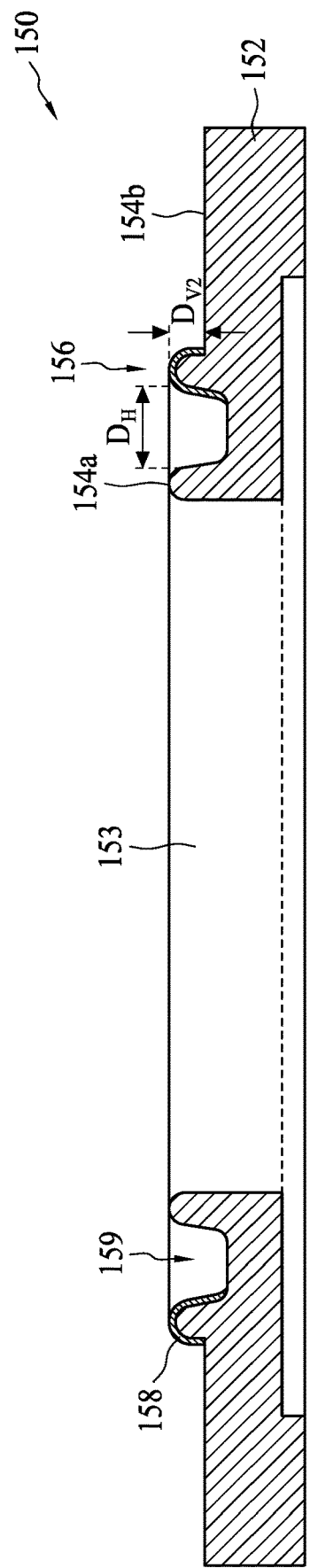
FIG. 5 is a schematic drawing illustrating a deposition ring according to aspects of one or more embodiments of the present disclosure.

The barrier structure 156 is separated from the first top surface 154a by a horizontal distance $D_H$, which is defined between a vertical sidewall of the barrier structure 156 that faces the first top surface 154a and a vertical wall of the ring body 152 that is coupled to the first top surface 154a and faces the barrier structure 156, as shown in FIG. 2. In other embodiments, when the barrier structure 156 includes the insulating film 158, the horizontal distance $D_H$ is defined between a vertical surface of the insulating film 158 that faces the first top surface 154a and the vertical wall of the ring body 152 that is coupled to the first top surface 154a and faces the barrier structure 156, as shown in FIGS. 3 to 5. In some embodiments, the horizontal distance $D_H$ is greater than 0.

As shown in FIGS. 2 to 5, in some embodiments, a first vertical distance $D_{V1}$ is defined between a top surface of the barrier structure 156 and the first top surface 154a of the ring body 152, and a second vertical distance $D_{V2}$ is defined between the top surface of the barrier structure 156 and the second top surface 154b of the ring body 152, as shown in FIG. 2. In some embodiments, when the barrier structure 156 includes the insulating film 158, the top surface is a surface of the insulating film 158. Accordingly, the first vertical distance $D_{V1}$ is defined between the top surface of the insulating film 158 of the barrier structure 156 and the first top surface 154a of the ring body 152, and the second vertical distance $D_{V2}$ is defined between the top surface of the insulating film 158 of the barrier structure 156 and the second top surface 154b of the ring body 152, as shown in FIGS. 3 to 5.

In some embodiments, the first top surface 154a and the second top surface 154b of the ring body 152 are not coplanar with each other. For example, the first top surface 154a is higher than the second top surface 154b, as shown in FIGS. 2 and 3. In some embodiments, the first vertical distance $D_{V1}$ and the second vertical distance $D_{V2}$ are different from each other, as shown in FIGS. 2 and 3. In some embodiments, both of the first and second vertical distances $D_{V1}$ and $D_{V2}$ are greater than 0, and the second vertical distance $D_{V2}$ is greater than the first vertical distance $D_{V1}$, as shown in FIGS. 2 and 3. In addition, a groove 159 may be disposed between the barrier structure 156 and the first top surface 154a. Shapes of the barrier structure 156 or the groove 159 can be modified. The modified shapes are also included in the scope of the present disclosure.

In some embodiments, the first top surface 154a and the second top surface 154b of the ring body 152 are coplanar with each other, as shown in FIG. 4. In some embodiments, the first vertical distance $D_{V1}$ and the second vertical distance $D_{V2}$ are the same, as shown in FIG. 4. In such embodiments, both of the first and second vertical distances $D_{V1}$ and $D_{V2}$ are greater than 0. In addition, a groove 159 may be disposed between the barrier structure 156 and the first top surface 154a. Shapes of the barrier structure 156 or the groove 159 can be modified. The modified shapes are also included in the scope of the present disclosure.

Referring to FIG. 5, in some embodiments, the first top surface 154a and the second top surface 154b of the ring body 152 are not coplanar with each other. For example, the first top surface 154a is higher than the second top surface 154b, as shown in FIG. 5. In some embodiments, the top surface of the barrier structure 156 or the top surface of the insulating film 158 is coplanar with the first top surface 154a of the ring body 152. Therefore the first vertical distance $D_{v1}$ is equal to 0. In such embodiments, the first vertical distance $D_{v1}$ and the second vertical distance $D_{v2}$ are different from each other. As shown in FIG. 5, the second vertical distance $D_{v2}$ is greater than the first vertical distance $D_{v1}$.

Referring to FIGS. 6 to 10, in some embodiments, the process kit 140 can include a deposition ring 151. As shown in FIGS. 6 to 10, the deposition ring 151 includes a ring body 152 having a first top surface 154a and a second top surface 154b, and a barrier structure 156a, 156b disposed between the first top surface 154a and the second top surface 154b. In some embodiments, the barrier structure includes at least a first portion 156a and a second portion 156b. In other embodiments, the barrier structure 156a, 156b can include more than two portions. In some embodiments, the first top surface 154a is an annular surface, the first portion 156a of the barrier structure is an annular portion surrounding the first top surface 154a, the second portion 156b of the barrier structure is an annular portion surrounding the first portion 156a, and the second top surface 154b is an annular surface surrounding the first top surface 154a and the barrier structure 156a, 156b. In some embodiments, the ring body 152 and the barrier structure 156a, 156b are monolithic. In some embodiments, the ring body 152 and the barrier structure 156a, 156b include a same material, such as a conductive material. For example but not limited thereto, the ring body 152 and the barrier structure 156a, 156b may include stainless steel, as shown in FIGS. 6 to 10, but the disclosure is not limited thereto. In some embodiments, an insulating film 158 is disposed on the first portion 156a and the second portion 156b of the barrier structure, as shown in FIGS. 7 to 10. In some embodiments, the insulating film 158 includes $Al_xO_Y$ or $Al_xN_Y$, but the disclosure is not limited thereto. It should be noted that in some embodiments, the insulating film 158 is disposed or coated on both of the first portion 156a and the second portion 156b, as shown in FIGS. 7 to 10. In other embodiments, the insulating film 158 can be disposed on the first portion 156a only. In still other embodiments, the insulating film 158 can be disposed on the second portion 156b, only.

Figure 6:
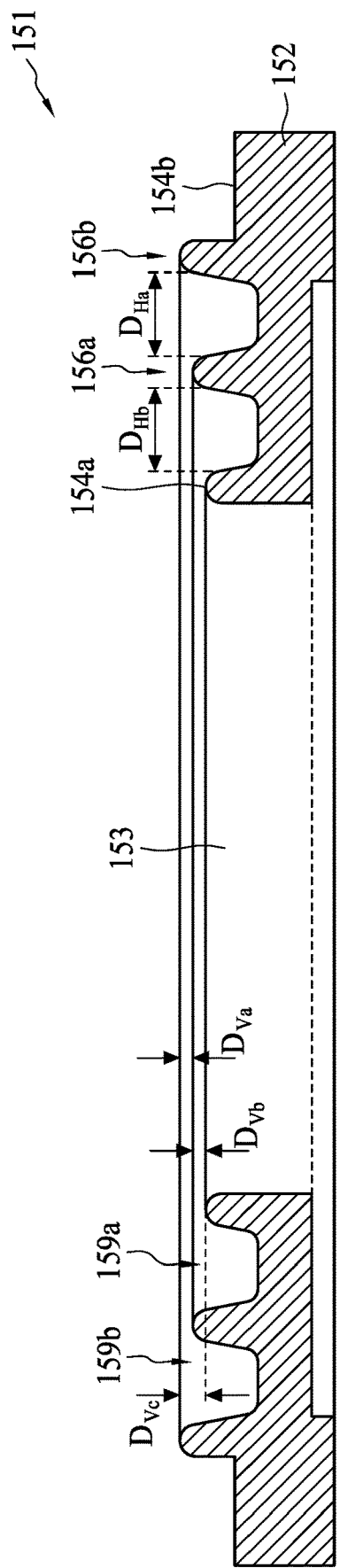
FIG. 6 is a schematic drawing illustrating a deposition ring according to aspects of one or more embodiments of the present disclosure.

In some embodiments, the first portion 156a and the second portion 156b are separated from each other by a first horizontal distance $D_{Ha}$, which is defined by a vertical sidewall of the first portion 156a that faces the second portion 156b and a vertical sidewall of the second portion 156b that faces the first portion 156a, as shown in FIG. 6. Further, the first top surface 154a of the ring body 152 and the first portion 156a of the barrier structure are separated by a second horizontal distance $D_{Hb}$, which is defined between the vertical sidewall of the first portion 156a that faces the first top surface 154a and a vertical wall of the ring body 152 that is coupled to the first top surface 154a and faces the first portion 156a, shown in FIG. 6. In some embodiments, when the first portion 156a and the second portion 156b include the insulating film 158, the first horizontal distance $D_{Ha}$ is defined between a vertical surface of the insulating film 158 on the first portion 156a that faces the second portion 156b and a vertical surface of the insulating film 158 on the second portion 156b that faces the first portion 156a, as shown in FIGS. 7 to 10. Further, the second horizontal distance $D_{Hb}$, is defined between the vertical surface of the insulating film 158 on the first portion 156a (and facing the first top surface 154a) and the vertical wall of the ring body 152 that is coupled to the first top surface 154a (and faces the first portion 156a), as shown in FIGS. 7 to 10. Both of the first horizontal distance $D_{Ha}$ and the second horizontal distance $D_{Hb}$ are greater than 0. In some embodiments, the first horizontal distance $D_{Ha}$ and the second horizontal distance $D_{Hb}$ are the same.

As shown in FIG. 6, in some embodiments, a first vertical distance $D_{Va}$ is defined between a top surface of the first portion 156a and a top surface of the second portion 156b, a second vertical distance $D_{Vb}$ is defined between the first top surface 154a of the ring body 152 and the top surface of the first portion 156a of the barrier structure, and a third vertical distance $D_{Vc}$ is defined between the first top surface 154a of the ring body 152 and the top surface of the second portion 156b of the barrier structure. The third vertical distance $D_{Vc}$ can be a sum of the first vertical distance $D_{Va}$ and the second vertical distance $D_{Vb}$. In some embodiments, when the first portion 156a and the second portion 156b of the barrier structure 156 include the insulating film 158, the top surface is a surface of the insulating film 158, as shown in FIGS. 7 to 10. Accordingly, the first vertical distance $D_{Va}$ is defined between the top surface of the insulating film 158 on the first portion 156a and the top surface of the insulating film 158 on the second portion 156b, the second vertical distance $D_{Vb}$ is defined between the top surface of the insulating film 158 on the first portion 156a and the first top surface 154a of the ring body 152, and the third vertical distance $D_{Vc}$ is defined between the insulating film 158 on the second portion 156b of the barrier structure and the first top surface 154a of the ring body 152, as shown in FIGS. 7 to 10.

Figure 7:
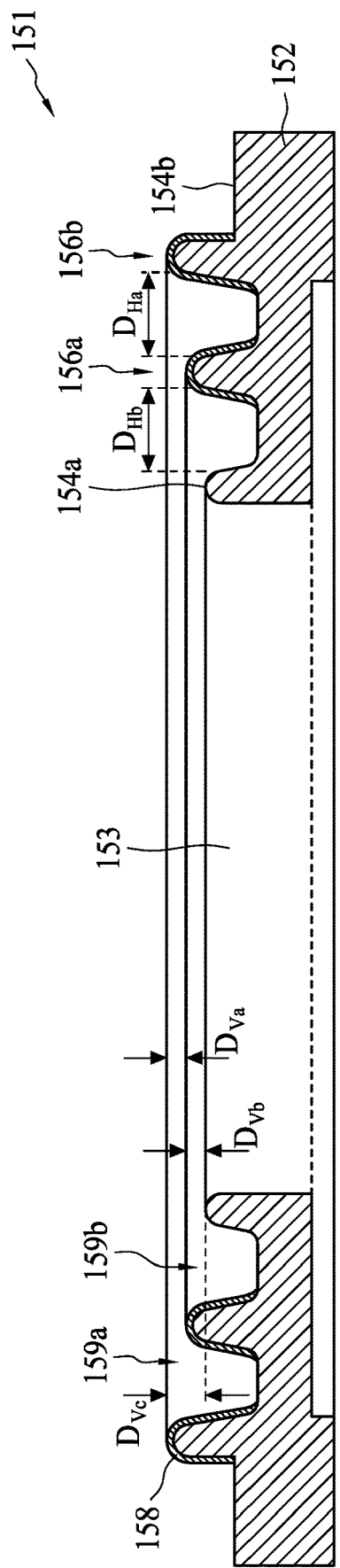
FIG. 7 is a schematic drawing illustrating a deposition ring according to aspects of one or more embodiments of the present disclosure.
Figure 8:
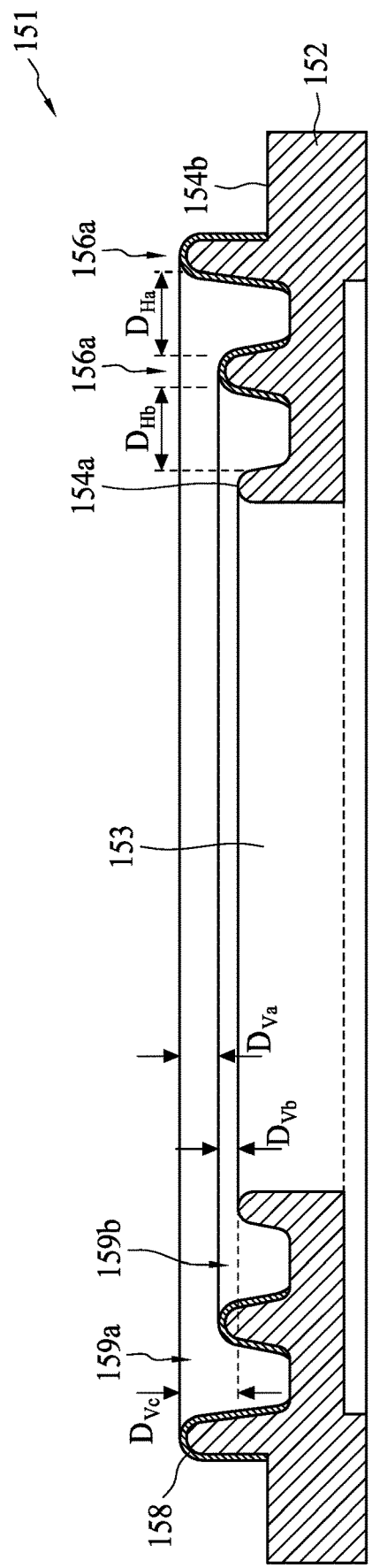
FIG. 8 is a schematic drawing illustrating a deposition ring according to aspects of one or more embodiments of the present disclosure.

In some embodiments, the first top surface 154a and the second top surface 154b are not coplanar with each other. For example, the first top surface 154a is higher than the second top surface 154b, as shown in FIGS. 6 to 8. In some embodiments, the first vertical distance $D_{Va}$ and the second vertical distance $D_{Vb}$ are the same, as shown in FIGS. 6 and 7. In other embodiments, the first vertical distance $D_{Va}$ and the second vertical distance $D_{Vb}$ are different from each other. For example, the second vertical distance $D_{Vb}$ is greater than the first vertical distance $D_{Va}$, as shown in FIG. 8. In still other embodiments, the second vertical distance $D_{Vb}$ can be less than the first vertical distance $D_{Va}$, though such arrangement is not shown. In some embodiments, both of the first and second vertical distances $D_{Va}$ and $D_{Vb}$ are greater than 0, as shown in FIGS. 6 to 8. In addition, a groove 159a may be disposed between the first portion 156a and the second portion 156b, and a groove 159b may be disposed between the first portion 156a and the first top surface 154a. Shapes of the first portion 156a and the second portion 156b of the barrier structure or the grooves 159a and 159b can be modified. The modified shapes are also included in a scope of the present disclosure.

Figure 9:
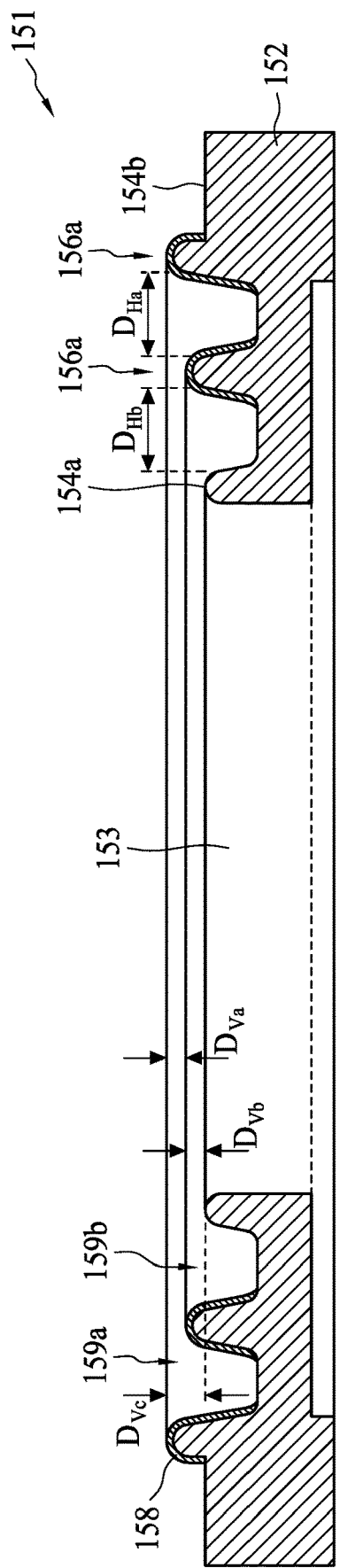
FIG. 9 is a schematic drawing illustrating a deposition ring according to aspects of one or more embodiments of the present disclosure.
Figure 10:
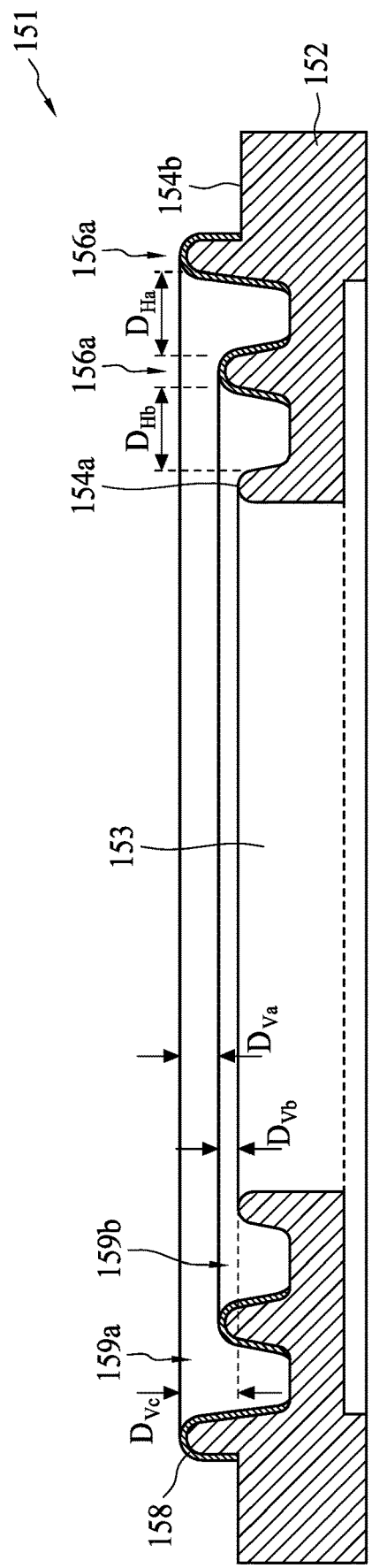
FIG. 10 is a schematic drawing illustrating a deposition ring according to aspects of one or more embodiments of the present disclosure.

In some embodiments, the first top surface 154a and the second top surface 154b are flush with each other, as shown in FIGS. 9 and 10. In some embodiments, the first vertical distance $D_{Va}$ and the second vertical distance $D_{Vb}$ are the same, as shown in FIG. 9. In other embodiments, the first vertical distance $D_{Va}$ is greater than the second vertical distance $D_{Vb}$, as shown in FIG. 10. In still other embodiments, the second vertical distance $D_{Vb}$ can be greater than the first vertical distance $D_{Va}$, though such arrangement is not shown.

Figure 11:
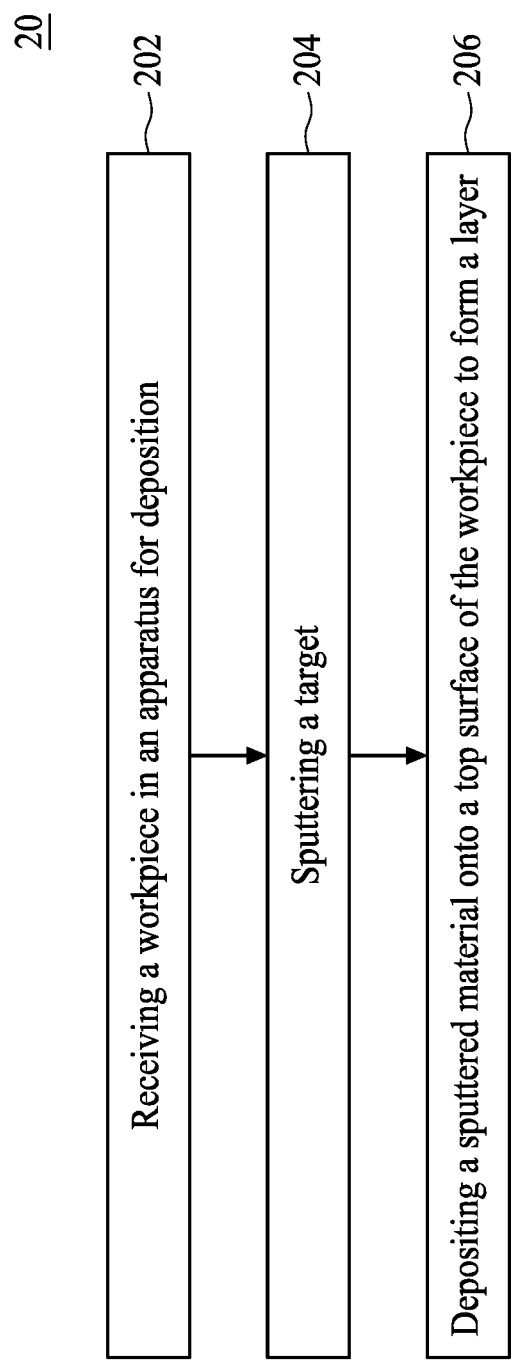
FIG. 11 is a flow diagram of a method for forming a layer in accordance with some embodiments of the present disclosure.
Figure 12A:
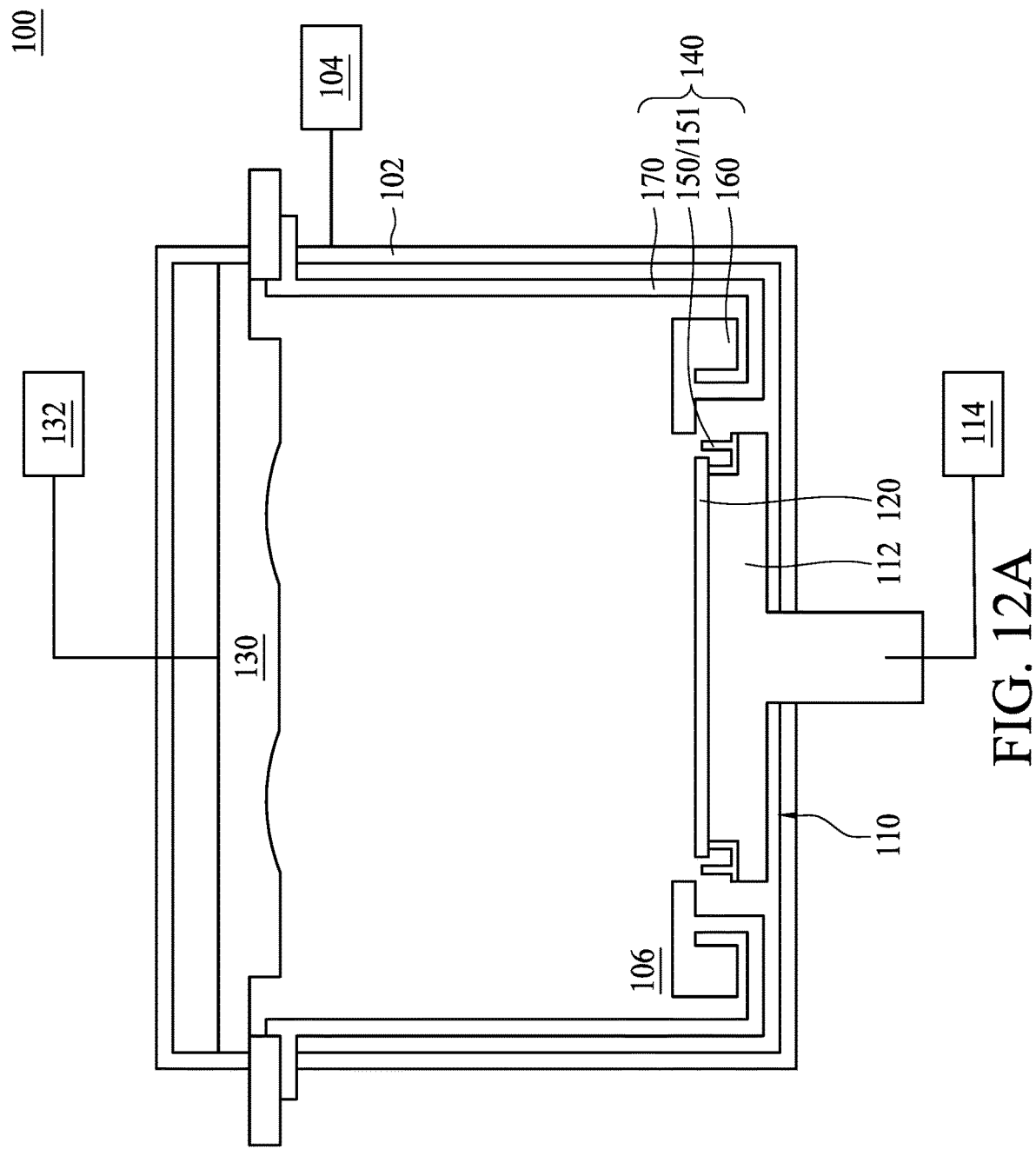
FIGS. 12A and 12B are schematic views of different stages in a method for forming a layer in accordance with some embodiments of the present disclosure.
Figure 12B:
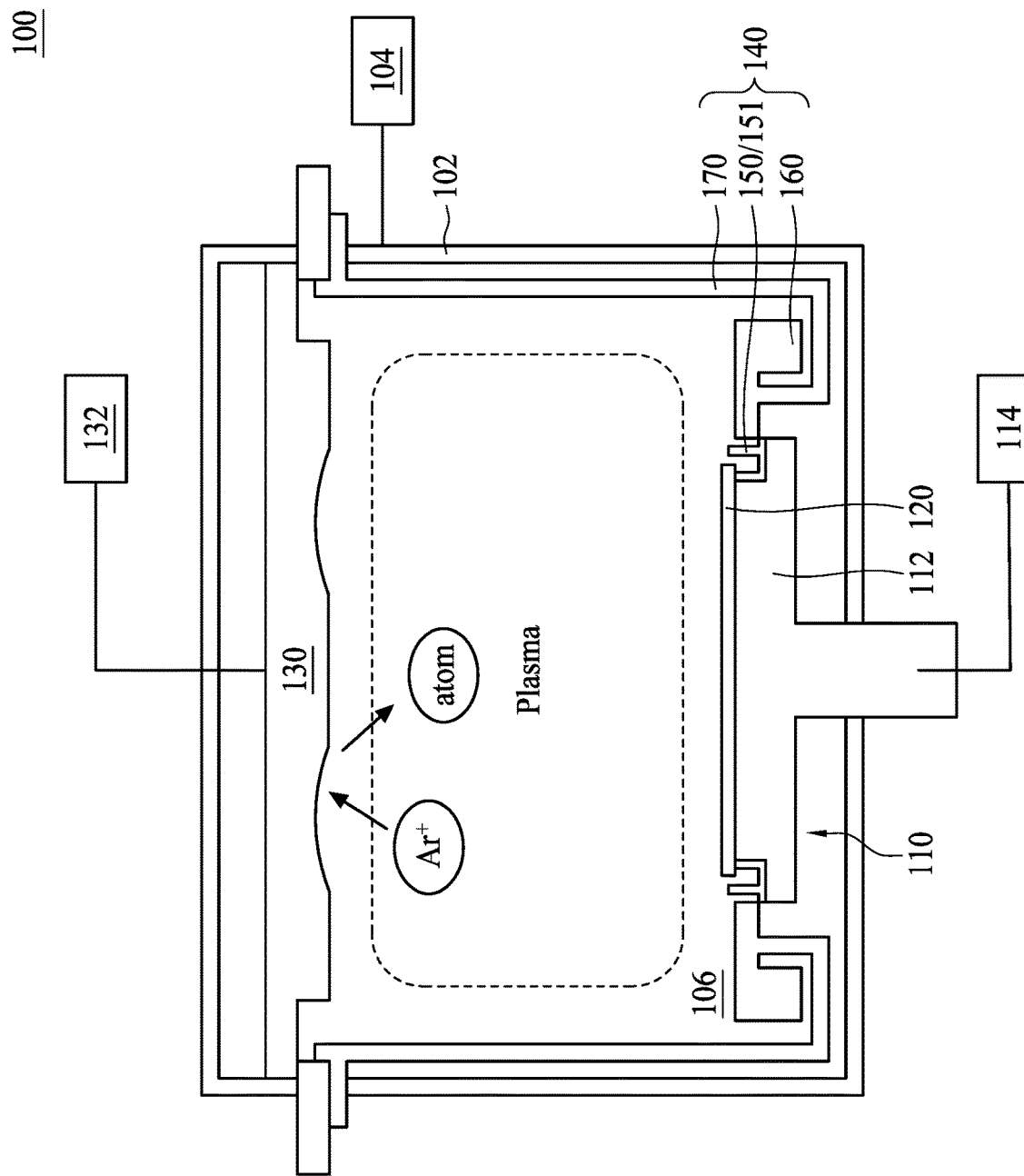
Figure 13:
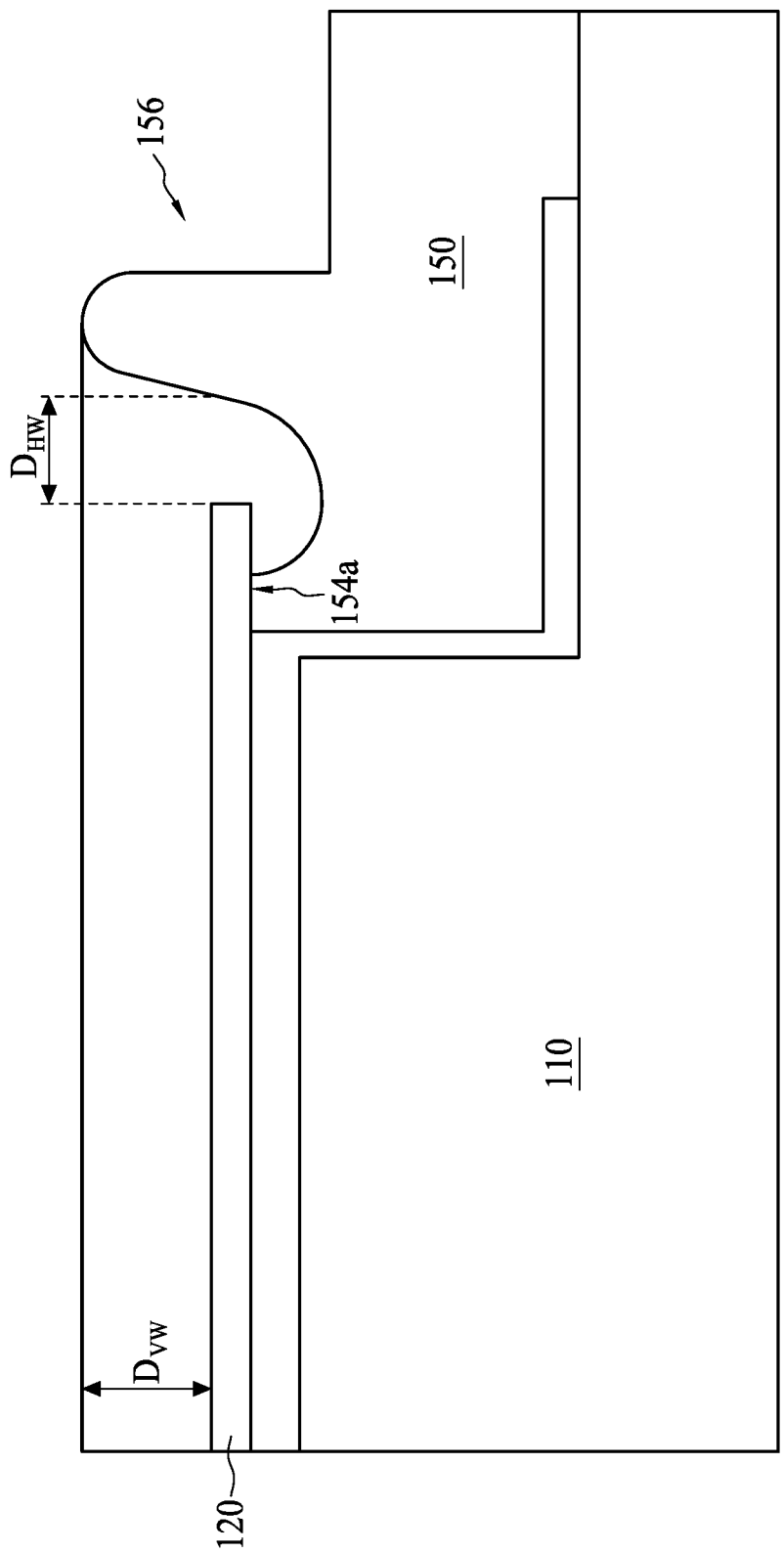
FIG. 13 is an enlarged partial view of FIG. 12B.

Please refer to FIGS. 11 to 13, wherein FIG. 11 is a flow diagram of a method for forming a layer in accordance with some embodiments of the present disclosure, FIGS. 12A and 12B are schematic views of different stages in a method for forming a layer in accordance with some embodiments of the present disclosure, and FIG. 13 is an enlarged partial view of FIG. 12B. In some embodiments, a method for forming a layer 20 is provided. The method 20 can include operations 202, 204 and 206.

Referring to FIG. 12A, in some embodiments, in operation 202, a workpiece such as a wafer 120 is received in an apparatus for deposition, such as the abovementioned apparatus for PVD 100. The wafer 120 can be positioned in the chamber 106 through a wafer port (not shown). In some embodiments, the wafer 120, being placed on the pedestal 110 is raised to an operation position with the heater touching the cover ring 160 of the process kit 140 as shown in FIG. 12B. In some embodiments, a bottom surface of the wafer 120 may be in contact with the first top surface 154a of the ring body 152 of the deposition ring 150, as shown in FIG. 13. It should be noted that although the deposition ring 150 is illustrated in FIGS. 12A, 12B and 13, those skilled in that art would easily realize that the deposition ring 151 can be used in some embodiments, though not shown.

Referring to FIGS. 12B and 13, in operation 204, the target 130 is sputtered. As mentioned above, the target 130 is posed of metal or metal alloys which are predetermined to be deposited onto the wafer 120. In some embodiments, a plasma may be introduced to impact the surface of the target 130, which may be electrically biased by the power supply 132. Atoms, molecules and/or ions may be generated from the target 130. In some embodiments, a pressure within the chamber 106 is adjusted to a desirable pressure. A reactant gas such as argon (Ar) or nitrogen (Ni) is introduced into the chamber 106 until an optimum condition for igniting plasma is reached and the plasma source 104 can be turned on to ignite the plasma. Ions, such as Ar or N ions in the plasma, are accelerated and the target 130 is struck by the ions. Consequently, the target 130 is sputtered and the sputtered material is deposited onto a top surface of the wafer 120 to form a layer in operation 206. In operations 204 and 206, the barrier structure 156 may alter electron density distribution during the depositing the sputter material, which will be described in FIGS. 14-16.

Still referring to FIG. 13, in some embodiments, a horizontal distance $D_{HW}$ defined by an edge of the wafer 120 and the barrier structure 156, is between approximately 0.01 mm and approximately 10 mm. In some comparative embodiments, when the horizontal distance $D_{HW}$ is less than 0.01 mm, the barrier structure 156 may be too close to the edge of the wafer 120 to alter electron density distribution. In some comparative embodiments, when the horizontal distance $D_{HW}$ is greater than 10 mm, the alteration provided by the barrier structure 156 may be too far from the wafer 120 to make sufficient difference. In some embodiments, a vertical distance $D_{VW}$, defined by a top surface of the barrier structure 156 and a top surface of the wafer 120 is between approximately 0 mm and approximately 50 mm. In some embodiments, the top surface of the barrier structure 156 can be higher than the top surface of the wafer 120. In other embodiments, the top surface of the barrier structure 156 can be lower than the top surface of the wafer 120. Therefore, the vertical distance $D_{VW}$ between the top surface of the barrier structure 156 and the top surface of the wafer 120 can be between approximately 0 mm and approximately 50 mm. In some comparative embodiments, when the vertical distance between the top surface of the barrier structure 156 and the top surface of the wafer 120 is greater than 50 mm, the barrier structure 156 may fail to alter electron density distribution. In some comparative embodiments, when the vertical distance between the top surface of the barrier structure 156 and the top surface of the wafer 120 is greater than 50 mm, the barrier structure 156 may obstruct material deposition. In some embodiments, when the insulating film 158 is coated on the barrier structure 156 (including the first portion 156a and/or the second portion 156b), the vertical distance $D_{VW}$ can be defined by a top surface of the insulating film 158 and the top surface of the wafer 120, and the distance between the top surface of the insulating film 158 and the top surface of the wafer 120 can be between approximately -50 mm and approximately 50 mm, but the disclosure is not limited thereto.

Figure 14:
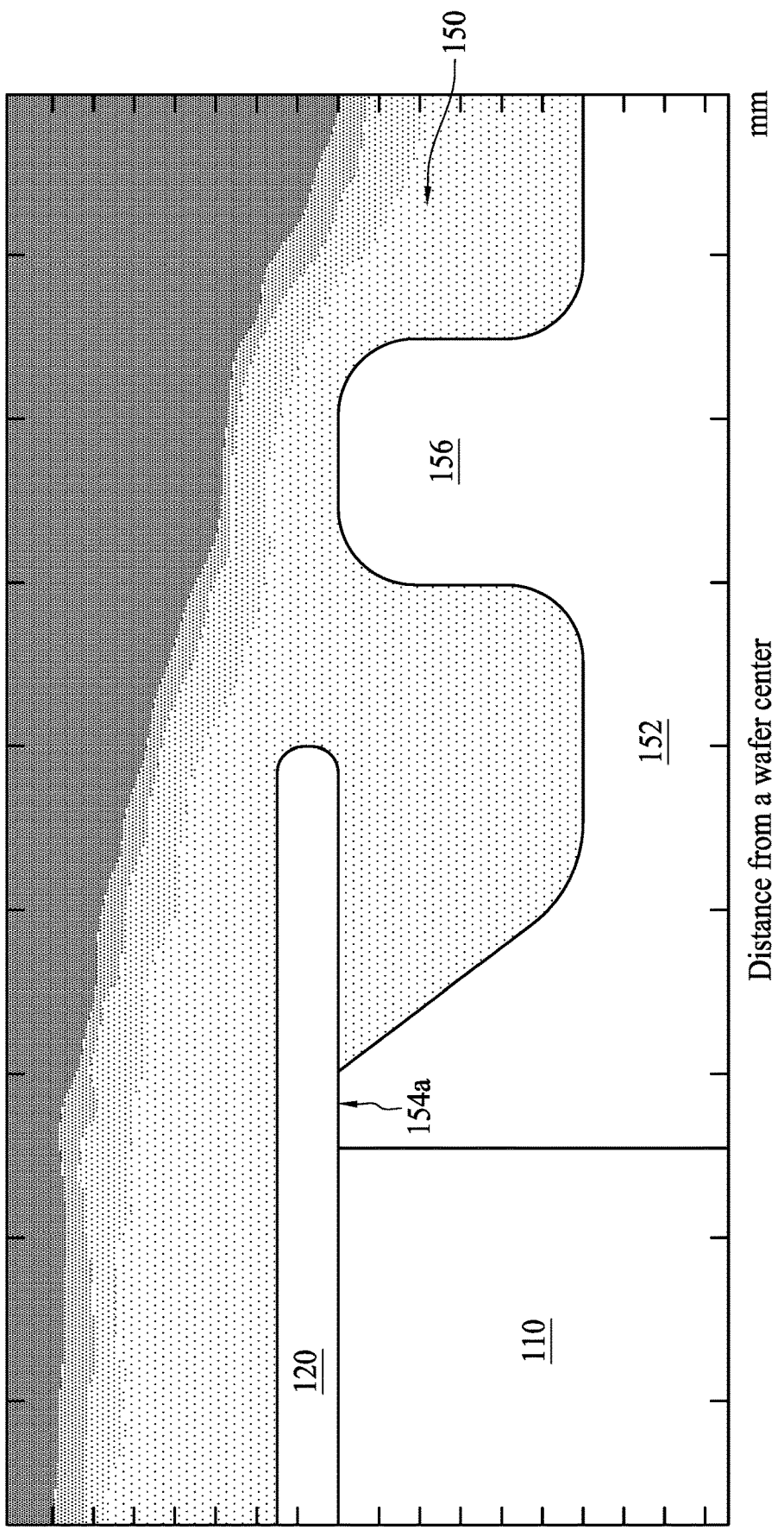
FIG. 14 is a chart illustrating an electron density distribution during a PVD operation in the apparatus according to aspects of one or more embodiments of the present disclosure.

FIG. 14 is a chart illustrating an electron density distribution during a PVD operation in the apparatus 100 according to aspects of one or more embodiments of the present disclosure. It should be noted that the insulating film 158 is omitted from FIG. 14 for the purpose of clarity. In some comparative embodiments, in which no barrier structure 156 is adopted, the electron density around the wafer edge may be greater than $0.5 \times 10^{15}$ m$^{-3}$. In some embodiments, in which the barrier structure 156 having the top surface coplanar with the first top surface 154a of the ring body 152 is adopted, the electron density distribution in the plasma is altered. Additionally, the top surface of the barrier structure 156 is lower than the top surface of the wafer 120. For example, the electron density around the wafer edge may be reduced from $0.5 \times 10^{15}$ m$^{-3}$ to less than $0.3 \times 10^{15}$ m$^{-3}$, but the disclosure is not limited thereto. In some embodiments, the electron density around the wafer edge is reduced by more than 20%, but the disclosure is not limited thereto. Significantly, because the electron density is reduced, an incidence rate of arcing is reduced.

Figure 15:
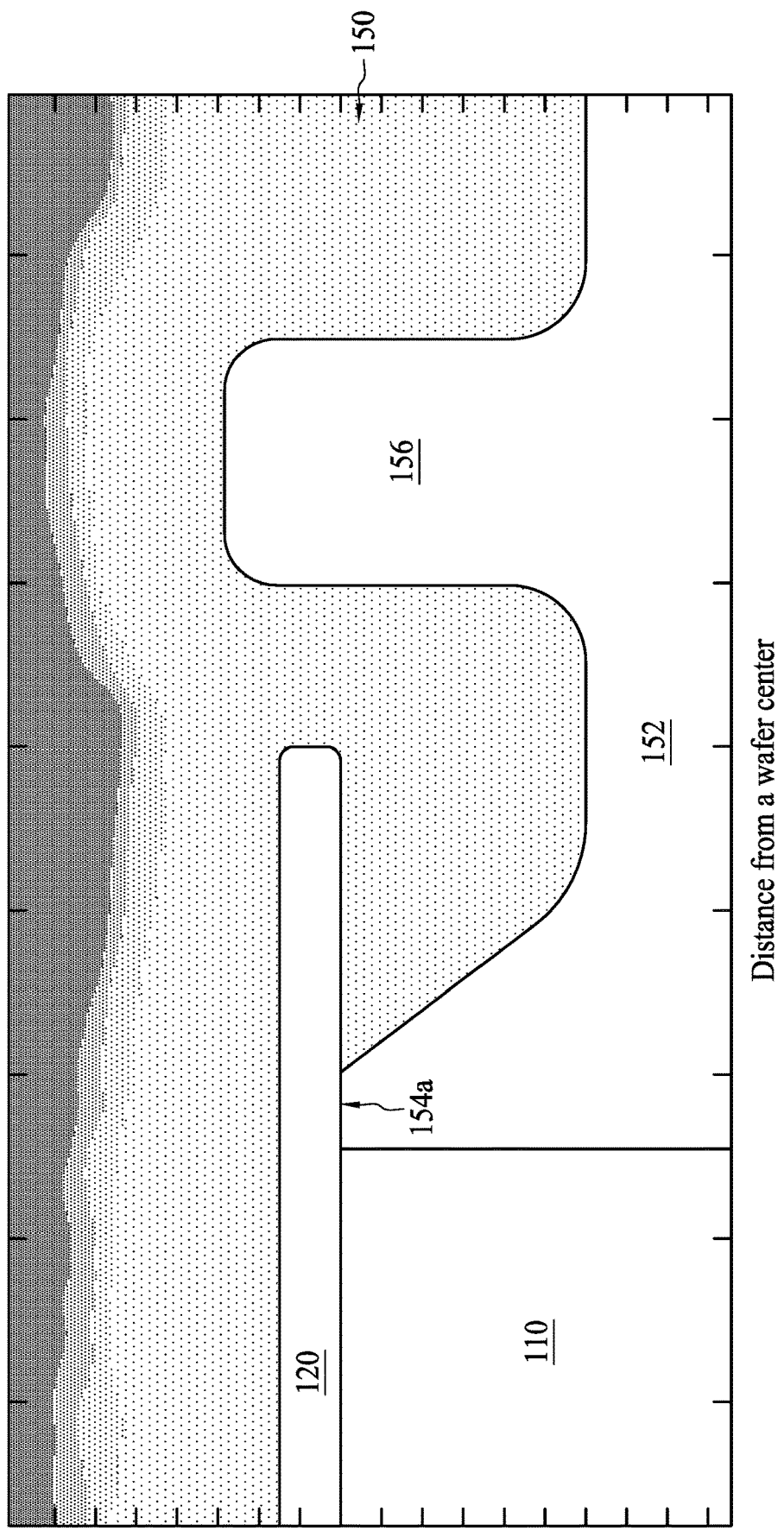
FIG. 15 is a chart illustrating an electron density distribution during a PVD operation in the apparatus according to aspects of one or more embodiments of the present disclosure.

FIG. 15 is a chart illustrating an electron density distribution during a PVD operation in the apparatus 100 according to aspects of one or more embodiments of the present disclosure. It should be noted that the insulating film 158 is omitted from FIG. 15 for the purpose of clarity. In some comparative embodiments, in which no barrier structure 156 is adopted, the electron density around the wafer edge may be greater than $0.5 \times 10^{15}$ m$^{-3}$. In some embodiments, in which the barrier structure 156 having the top surface higher than the first top surface 154a is adopted, the electron density distribution in the plasma is altered. Additionally, the top surface of the barrier structure 156 is higher than the top surface of the wafer 120. For example, the electron density around the wafer edge may be reduced from $0.5 \times 10^{15}$ m$^{-3}$ to less than $0.3 \times 10^{15}$ m$^{-3}$, but the disclosure is not limited thereto. It can be found that a portion of the plasma with greater electron density (e.g., electron density greater than $0.3 \times 10^{15}$ m$^{-3}$) is pushed away from the wafer edge. In some embodiments, the electron density around the wafer edge is reduced by more than 30%, but the disclosure is not limited thereto. Significantly, because the electron density is reduced, an incidence rate of arcing is reduced.

Figure 16:
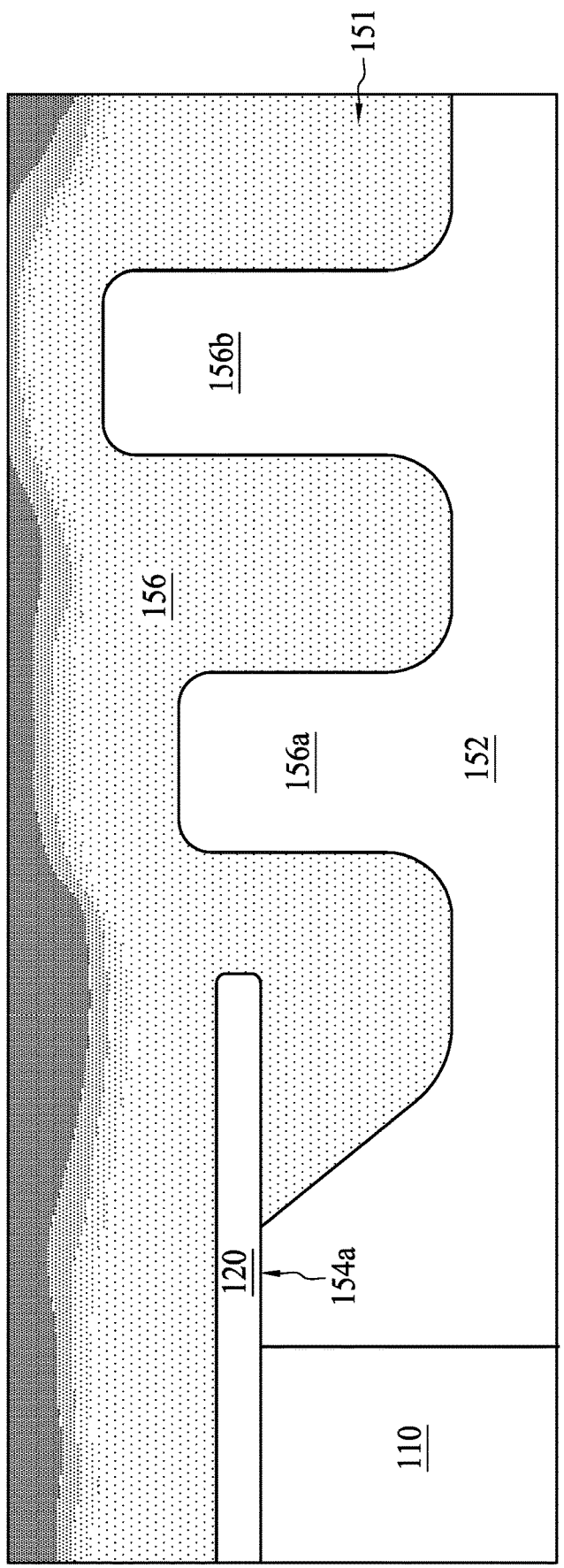
FIG. 16 is a chart illustrating an electron density distribution during a PVD operation in the apparatus according to aspects of one or more embodiments of the present disclosure.

FIG. 16 is a chart illustrating an electron density distribution during a PVD operation in the apparatus 100 according to aspects of one or more embodiments of the present disclosure. It should be noted that the insulating film 158 is omitted from FIG. 16 for the purpose of clarity. As mentioned above, in some comparative embodiment in which no barrier structure is adopted, the electron density around the wafer edge may be greater than $0.5 \times 10^{15}$ m$^{-3}$. In some embodiments, when the barrier structure including the first portion 156a and the second portion 156b is adopted, the electron density distribution in the plasma is altered. For example, the electron density around the wafer edge may be reduced from $0.5 \times 10^{15}$ m$^{-3}$ to less than $0.3 \times 10^{15}$ m$^{-3}$, but the disclosure is not limited thereto. It can be found that a portion of the plasma with greater electron density (e.g., electron density greater than $0.3 \times 10^{15}$ m$^{-3}$) is pushed away from the wafer edge by the first portion 156a and the second portion 156b. In some embodiments, the electron density around the wafer edge is reduced by more than 30%, but the disclosure is not limited thereto. Significantly, because the electron density is reduced, an incidence rate of arcing is reduced.

As shown in FIGS. 14 to 16, because the electron density distribution of the plasma is altered by the barrier structure 156 of the deposition ring 150 or the barrier structure (i.e., the first portion 156a and the second portion 156b) of the deposition ring 151, the electron density around the wafer edge is reduced and thus the incidence rate of arcing is reduced. Consequently, the arcing issue is mitigated.

Accordingly, there is no need to adjust the PVD operation or parameters in order to avoid the arcing issue. In other words, the operation is simplified. Further, the arcing issue can be mitigated without reducing PVD throughput or increasing energy consumption. In some embodiments, because the deposition rings 150 and 151 effectively mitigate the arcing issue, additional cleaning processes for removing the residue over the wafer 120 can be omitted, and thus the overall throughput can be increased and process cost can be reduced.

The present disclosure provides an apparatus for PVD to mitigate the arcing issue without reducing PVD throughput, increasing process cost, or increasing energy consumption. In some embodiments, a deposition ring including a barrier structure is provided. The barrier structure of the deposition ring is able to alter the electron density distribution and thus electron density of the plasma around the wafer edge is reduced. Accordingly, incidence rate of arcing can be reduced. In other words, the arcing issue is mitigated although there still is residue over the wafer edge.

In some embodiments, a ring is provided. The ring includes a ring body having a first top surface and a second top surface, and a barrier structure disposed between the first top surface and the second top surface. In some embodiments, the barrier structure is separated from the first top surface by a horizontal distance. A first vertical distance is defined between the barrier structure and the first top surface, and a second vertical distance is defined between the barrier structure and the second top surface. In some embodiments, the second vertical distance is equal to or greater than the first vertical distance.

In some embodiments, an apparatus for PVD is provided. The apparatus includes a chamber, a pedestal disposed in the chamber to accommodate a wafer, and a ring. The ring includes a ring body having a first top surface and a second top surface, and a barrier structure disposed between the first top surface and the second top surface.

In some embodiments, a method for forming a layer is provided. The method includes following operations. A workpiece is received in an apparatus for deposition. In some embodiments, the apparatus for deposition includes a chamber, a pedestal disposed in the chamber to accommodate the workpiece, and a ring disposed on the pedestal. The ring includes a ring body having a first top surface and a second top surface and a barrier structure disposed between the first top surface and the second top surface. A vertical distance is defined by a top surface of the barrier structure and a top surface of the workpiece. In some embodiments, the vertical distance is between approximately 0 mm and approximately 50 mm. A target disposed in the apparatus for deposition is sputtered. A sputtered material is deposited onto a top surface of the workpiece to form a layer. In some embodiments, the barrier structure alters an electrical density distribution during the depositing the sputter material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ring, comprising:
 a ring body having a first top surface, a second top surface, a first bottom surface, a second bottom surface, an innermost sidewall coupled to the first top surface and the first bottom surface, an outermost sidewall coupled to the second top surface and the second bottom surface, the first bottom surface and the second bottom surface are parallel with each other, and the first bottom surface and the second bottom surface form a step height;
 a barrier structure disposed between the first top surface and the second top surface; and
 an insulating film over the barrier structure, wherein the first top surface and the second top surface of the ring body are free of the insulating film, and the insulating film comprises aluminum oxide or aluminum nitride,
 wherein the barrier structure comprises at least a first portion and a second portion,
 wherein the second portion is between the outermost sidewall and the first portion, the first portion and the second portion are separated by a first horizontal distance, a first vertical distance is defined between a top surface of the first portion and a top surface of the second portion, and the top surface of the second portion is higher than the top surface of the first portion, and
 wherein the top surface of the first portion of the barrier structure, the top surface of the second portion of the barrier structure and the first top surface of the ring body are higher than the second top surface of the ring body,
 wherein the insulating film over the first portion of the barrier structure entirely overlaps the first bottom surface, and
 wherein the insulating film is disposed over the first portion and the second portion of the barrier structure, and a lower surface of a first groove between the first portion and the second portion of the barrier structure is free of the insulating film.

2. The ring of claim 1, wherein the first top surface is an annular surface, the first portion of the barrier structure is an annular portion surrounding the first top surface, the second portion of the barrier structure is an annular portion surrounding the first portion, and the second top surface is an annular surface surrounding the first top surface and the barrier structure.

3. The ring of claim 1, wherein the first top surface and the first portion of the barrier structure are separated by a second horizontal distance.

4. The ring of claim 3, wherein the first horizontal distance and the second horizontal distance are the same.

5. The ring of claim 1, wherein a second vertical distance is defined between the first top surface and the top surface of the first portion of the barrier structure.

6. The ring of claim 5, wherein the first vertical distance and the second vertical distance are the same.

7. The ring of claim 1, wherein the first vertical distance and the second vertical distance are different.

8. The ring of claim 1, wherein the ring body and the barrier structure comprise a conductive material.

9. The ring of claim 1, further comprising:
 a second groove between the first top surface and the first portion of the barrier structure; and.

10. The ring of claim 9, wherein the lower surface of the first groove and a lower surface of the second groove are aligned with each other.

11. The ring of claim 1, wherein a width of the first bottom surface is greater than a width of the second bottom surface.

* * * * *